United States Patent
Li et al.

(10) Patent No.: US 11,953,605 B2
(45) Date of Patent: Apr. 9, 2024

(54) METHOD, DEVICE, EQUIPMENT, AND STORAGE MEDIUM FOR DETERMINING SENSOR SOLUTION

(71) Applicant: BEIJING BAIDU NETCOM SCIENCE TECHNOLOGY CO., LTD., Beijing (CN)

(72) Inventors: Chongchong Li, Beijing (CN); Jun Wang, Beijing (CN)

(73) Assignee: BEIJING BAIDU NETCOM SCIENCE TECHNOLOGY CO., LTD. (CN)

( * ) Notice: Subject to any disclaimer, the term of this patent is extended or adjusted under 35 U.S.C. 154(b) by 612 days.

(21) Appl. No.: 17/151,482

(22) Filed: Jan. 18, 2021

(65) Prior Publication Data

US 2021/0190961 A1    Jun. 24, 2021

(30) Foreign Application Priority Data

Jan. 20, 2020    (CN) .......................... 202010066495.3

(51) Int. Cl.
*G01S 17/931*    (2020.01)
*G01S 17/89*    (2020.01)
(Continued)

(52) U.S. Cl.
CPC ............ *G01S 17/931* (2020.01); *G01S 17/89* (2013.01); *G05D 1/0248* (2013.01); *G06F 30/15* (2020.01);
(Continued)

(58) Field of Classification Search
CPC ........ G01S 17/931; G01S 17/89; G06F 30/15; G05D 1/0248; G05D 2201/0213; G08G 1/0104
(Continued)

(56) References Cited

U.S. PATENT DOCUMENTS

2009/0222776 A1    9/2009 Meers et al.
2015/0022192 A1    1/2015 Ausserlechner
(Continued)

FOREIGN PATENT DOCUMENTS

CN    103455663 A    12/2013
CN    107436986 A    12/2017
(Continued)

OTHER PUBLICATIONS

Wang, Shuiying et al., Shader-based Sensor Simulation for Autonomous Car Testing, 15th International IEEE Conference on Intelligent Transportation Systems, Sep. 16-19, 2012, pp. 224-229.
(Continued)

*Primary Examiner* — Mahmoud S Ismail
(74) *Attorney, Agent, or Firm* — Dilworth IP, LLC

(57) ABSTRACT

The present application discloses a method, a device, equipment, and storage medium for determining a sensor solution, where the method includes: establishing a simulated unmanned vehicle and a simulation scene, where the simulation scene is used for the simulated unmanned vehicle to perform simulation driving; determining a first sensor solution according to a initialization parameter, and determining, according to the first sensor solution, simulation data generated by the simulated unmanned vehicle during the simulation driving in the simulation scene; and; and determining a first perception parameter of the first sensor solution according to the simulation data, and correcting the first sensor solution according to the first perception parameter to obtain a sensor solution applied to an unmanned vehicle.

14 Claims, 5 Drawing Sheets

(51) Int. Cl.
  *G05D 1/00* (2006.01)
  *G06F 30/15* (2020.01)
  *G08G 1/01* (2006.01)

(52) U.S. Cl.
  CPC ... *G08G 1/0104* (2013.01); *G05D 2201/0213* (2013.01)

(58) Field of Classification Search
  USPC .......................................................... 701/28
  See application file for complete search history.

(56) References Cited

U.S. PATENT DOCUMENTS

| | | | |
|---|---|---|---|
| 2015/0323321 A1 | 11/2015 | Oumi | |
| 2016/0142679 A1 | 5/2016 | Miyoshi et al. | |
| 2016/0314224 A1 | 10/2016 | Wei et al. | |
| 2017/0132334 A1 | 5/2017 | Levinson et al. | |
| 2018/0188733 A1 | 7/2018 | Iandola et al. | |
| 2019/0179979 A1* | 6/2019 | Melick | G01P 21/02 |
| 2019/0278290 A1 | 9/2019 | Zhang et al. | |
| 2020/0109954 A1* | 4/2020 | Li | G01C 21/3852 |
| 2020/0250363 A1* | 8/2020 | Partridge | G06F 30/20 |

FOREIGN PATENT DOCUMENTS

| | | | |
|---|---|---|---|
| CN | 107844858 A | 3/2018 | |
| CN | 108290579 A | 7/2018 | |
| CN | 108802761 A | 11/2018 | |
| CN | 109032102 A | 12/2018 | |
| CN | 109444350 A | 3/2019 | |
| CN | 109515448 A | 3/2019 | |
| CN | 109709824 A | 5/2019 | |
| CN | 109960857 A | 7/2019 | |
| CN | 110162089 A | 8/2019 | |
| CN | 110412374 A | 11/2019 | |
| CN | 110462543 A | 11/2019 | |
| DE | 102004058703 A1 | 4/2006 | |
| GB | 2573738 A | 11/2019 | |
| JP | 2009193212 A | 8/2009 | |
| JP | 2018514042 A | 5/2018 | |
| WO | 2016198524 A1 | 12/2016 | |
| WO | 2017079229 A1 | 5/2017 | |
| WO | 2018071708 A1 | 4/2018 | |

OTHER PUBLICATIONS

European Search Report in EP Patent Application No. 21152299.0 date Jun. 14, 2021.

First Office Action in CN Patent Application No. 202010066495.3 dated Jan. 20, 2023.

First Office Action in JP Patent Application No. 2021-006472 dated Feb. 7, 2022.

Second Office Action in JP Patent Application No. 2021-006472 dated Sep. 6, 2022.

First Office Action in KR Patent Application No. 1020210007319 dated Jul. 25, 2022.

Min, Chen et al., Assessment of Sensor Positions Based on Numerical Simulation, Journal of Graphics, vol. 36, No. 6, Dec. 2015, pp. 868-871.

Dong, Sixing et al., Position Estimation in Permanent Magnet Synchronous Linear Motor Without Position Sensor, IEEE, 2016, pp. 1235-1238.

Notice of Allowance in CN Patent Application No. 202010066495.3 dated Jun. 30, 2023.

* cited by examiner

METHOD, DEVICE, EQUIPMENT, AND STORAGE MEDIUM FOR DETERMINING SENSOR SOLUTION

CROSS-REFERENCE TO RELATED APPLICATIONS

This application claims priority to Chinese Patent Application No. 202010066495.3, filed on Jan. 20, 2020, which is hereby incorporated by reference in its entirety.

TECHNICAL FILED

The present application relates to the technical field of unmanned vehicles and, in particular, to a method, a device, equipment and a storage medium for determining a sensor solution.

BACKGROUND

With the rapid development of unmanned vehicle technology, unmanned vehicles have been more and more widely promoted and applied. During automatic driving process of the unmanned vehicle, sensors installed on the unmanned vehicle are used to collect sensor data. An unmanned vehicle system formulates an automatic driving solution of the unmanned vehicle and analyzes automatic driving situation of the unmanned vehicle based on collected sensor data. Therefore, perception capability of the sensors installed on the unmanned vehicle is an important factor affecting safe driving of the unmanned vehicle.

In the related technology, the sensor data corresponding to obstacles with different sizes at different distances is calculated according to the physical parameters of the sensor, detection distance of the sensor is estimated according to the sensor data, and occlusion of obstacles is estimated according to model size of the unmanned vehicle to determine the sensor solution.

However, only starting from physical parameters of the sensor, a designed sensor solution has weak perception capability and low perception accuracy; at the same time, the detection distance accuracy of the sensor estimated only based on the size of the obstacle and the model size of the unmanned vehicle is poor, which is not beneficial to safe operation of the unmanned vehicle.

SUMMARY

Embodiments of the present application provide a method, a device, equipment and a storage medium for determining a sensor solution, which are used to solve the problems of weak sensor perception capability and low perception accuracy in existing sensor solution design methods.

In a first aspect, the present application provides a method for determining a sensor solution, where the method includes:

establishing a simulated unmanned vehicle and a simulation scene, where the simulation scene is used for the simulated unmanned vehicle to perform simulation driving;

determining a first sensor solution according to a initialization parameter, and determining, according to the first sensor solution, simulation data generated by the simulated unmanned vehicle during the simulation driving in the simulation scene; and determining the first perception parameter of the first sensor solution according to the simulation data, and correcting the first sensor solution according to the first perception parameter to obtain a sensor solution applied to unmanned vehicles.

In the above technical solution, firstly, the simulated unmanned vehicle, the simulation scene and the simulated sensor are established, the first sensor solution is determined according to the initialization parameter, and then based on the established simulated unmanned vehicle, simulation scene and simulated sensor, the first sensor solution is corrected by using simulation experiments to obtain a sensor solution applied to the unmanned vehicle. This method fully considers and combines physical parameters of the sensor, an obstacle shape and motion characteristics, model size and appearance of the unmanned vehicle, and the traffic environment in which the vehicle is running Therefore, the determined sensor solution for the unmanned vehicle has strong perception capability and higher perception accuracy, which can better guarantee the safe operation of the unmanned vehicle.

Optionally, the simulation scene includes a static simulation scene, and the determining, according to the first sensor solution, the simulation data generated by the simulated unmanned vehicle during the simulation driving in the simulation scene includes:

determining, according to the first sensor solution, a first sub-simulation data generated by the simulated unmanned vehicle during the simulation driving in the static simulation scene; and the determining the first perception parameter of the first sensor solution according to the simulation data, and correcting the first sensor solution according to the first perception parameter to obtain the sensor solution applied to the unmanned vehicle includes:

determining the first perception parameter of the first sensor solution according to the first sub-simulation data, and correcting the first sensor solution according to the first perception parameter to obtain the sensor solution applied to the unmanned vehicle.

In the above technical solution, according to the first sub-simulation data generated by the unmanned vehicle during the simulation driving in the static simulation environment, the first sensor solution is corrected, which fully considers the static scene that the unmanned vehicle may experience during the actual driving process. Therefore, the sensor solution made for the unmanned vehicle is more suitable for the demand of the actual driving process of the unmanned vehicle.

Optionally, the simulation scene includes a static simulation scene and a dynamic simulation scene, and the dynamic simulation scene includes at least one dynamic sub-simulation scene; and the determining, according to the first sensor solution, the simulation data generated by the simulated unmanned vehicle during the simulation driving in the simulation scene includes:

determining, according to the first sensor solution, a first sub-simulation data generated by the simulated unmanned vehicle during the simulation driving in the static simulation scene;

the determining the first perception parameter of the first sensor solution according to the simulation data, and correcting the first sensor solution according to the first perception parameter to obtain the sensor solution applied to the unmanned vehicle comprises:

determining the first perception parameter of the first sensor solution according to the first sub-simulation data, and correcting the first sensor solution according to the first perception parameter to obtain a second sensor solution;

determining, according to the second sensor solution, at least one second sub-simulation data generated by the simulated unmanned vehicle during the simulation driving in the at least one dynamic sub-simulation scene; and determining a second perception parameter of the second sensor solution according to each second sub-simulation data of the at least one second sub-simulation data, correcting the second sensor solution according to the second perception parameter to obtain a third sensor solution, and using the third sensor solution as the sensor solution applied to the unmanned vehicle.

In the above technical solution, the second sensor solution is corrected based on at least one second sub-simulation data generated by the unmanned vehicle during the simulation driving in each dynamic sub-simulation scene. The correction process fully considers various dynamic scenes that unmanned vehicles may experience during the actual driving process. The determined perception capability and perception accuracy of the sensor solution applied to the unmanned vehicle are more in line with the various scenes that may be experienced in the actual driving process of unmanned vehicles, and can better guarantee the safe operation of the unmanned vehicle.

Optionally, the determining, according to the first sensor solution, the simulation data generated by the simulated unmanned vehicle during the simulation driving in the simulation scene includes:

establishing a simulated sensor, and installing the simulated sensor in the simulated unmanned vehicle according to the first sensor solution; and determining the simulation data generated by the simulated unmanned vehicle installed with the simulated sensor during the simulation driving in the simulation scene.

In the above technical solution, a simulated sensor is firstly established, the simulated sensor is installed in the simulation unmanned vehicle according to the first sensor solution, and then the simulation data generated by the simulated unmanned vehicle installed with the simulated sensor during the simulation driving in the simulation scene is determined. The solution fully considers and combines the physical parameters of the sensor, the obstacle shape and movement characteristics, the model size and appearance of the unmanned vehicle, and the traffic environment in which the vehicle is running And the determined sensor solution applied to the unmanned vehicle has strong perception capability and higher perception accuracy, which can better guarantee the safe operation of the unmanned vehicle.

Optionally, the determining a first sensing parameter of the first sensor solution according to the simulation data and correcting the first sensor solution according to the first sensing parameter to obtain the sensor solution applied to the unmanned vehicle includes:

inputting the simulation data into a preset sensor perception algorithm to obtain the first perception parameter represented by the simulation data; and correcting, according to the first perception parameter and preset sensor perception capability requirement, the first sensor solution to obtain the sensor solution applied to the unmanned vehicle.

In the above technical solution, the preset sensor perception algorithm is used to obtain the first perception parameter represented by the simulation data, and the first sensor solution is corrected according to the perception parameter and the preset sensor perception capability requirement. Due to the reference of point cloud perception algorithm, obtaining the perception parameter from the dimension of the point cloud perception results is more scientific and accurate than calculating the perception parameter from sensor data.

Optionally, the sensor includes a lidar and a camera.

Optionally, the sensor solution includes one or more of the following:

sensor model, number of sensors, and sensor installation location.

In a second aspect, the present application provides a device for determining a sensor solution which includes:

a first processing unit, configured to establish a simulated unmanned vehicle and a simulation scene, wherein the simulation scene is used for the simulated unmanned vehicle to perform simulation driving;

a second processing unit, configured to determine a first sensor solution according to a initialization parameter, and determine, according to the first sensor solution, simulation data generated by the simulated unmanned vehicle during the simulation driving in the simulation scene; and a third processing unit, configured to determine a first perception parameter of the first sensor solution according to the simulation data, and correct the first sensor solution according to the first perception parameter to obtain a sensor solution applied to an unmanned vehicle.

Optionally, the simulation scene includes a static simulation scene, and the second processing unit includes:

a first processing subunit, configured to determine, according to the first sensor solution, a first sub-simulation data generated by the simulated unmanned vehicle during the simulation driving in the static simulation scene; and the third processing unit includes:

a second processing subunit, configured to determine the first perception parameter of the first sensor solution according to the first sub-simulation data, and correct the first sensor solution according to the first perception parameter to obtain the sensor solution applied to the unmanned vehicle.

Optionally, the simulation scene includes a static simulation scene and a dynamic simulation scene, and the dynamic simulation scene includes at least one dynamic sub-simulation scene; and the second processing unit includes:

a third processing subunit, configured to determine, according to the first sensor solution, a first sub-simulation data generated by the simulated unmanned vehicle during the simulation driving in the static simulation scene;

the third processing unit includes:

a fourth processing subunit, configured to determine the first perception parameter of the first sensor solution according to the first sub-simulation data, and correct the first sensor solution according to the first perception parameter to obtain a second sensor solution;

a fifth processing subunit, configured to determine, according to the second sensor solution, at least one second sub-simulation data generated by the simulated unmanned vehicle during the simulation driving in the at least one dynamic sub-simulation scene; and a sixth processing subunit, configured to determine a second perception parameter of the second sensor solution according to each second sub-simulation data of the at least one second sub-simulation data, correct the second sensor solution according to the second perception parameter to obtain a third sensor solution, and use the third sensor solution as the sensor solution applied to the unmanned vehicle.

Optionally, the second processing unit includes:

a seventh processing subunit, configured to establish a simulated sensor, and install the simulated sensor in the simulation unmanned vehicle according to the first sensor solution; and an eighth processing subunit, configured to determine the simulation data generated by the simulated unmanned vehicle installed with the simulated sensor during the simulation driving in the simulation scene.

Optionally, the third processing unit includes:

a ninth processing subunit, configured to input the simulation data into a preset sensor perception algorithm to obtain a first perception parameter represented by the simulation data; and a tenth processing subunit, configured to correct, according to the first perception parameter and preset sensor perception capability requirement, the first sensor solution to obtain the sensor solution applied to the unmanned vehicle.

Optionally, the sensor includes a lidar and a camera.

Optionally, the sensor solution includes one or more of the following:

sensor model, number of sensors, and sensor installation location.

In a third aspect, the present application provides electronic equipment, which includes:

at least one processor; and a memory communicatively connected with the at least one processor; wherein, the memory stores instructions that can be executed by the at least one processor, and the instructions are executed by the at least one processor to enable the at least one processor to execute the method according to any one of the first aspect.

In a fourth aspect, the present application provides a non-transitory computer-readable storage medium storing computer instructions, where the computer instructions are used for causing the computer to execute the method described in any one of the first aspect.

In a fifth aspect, the present application provides a computer program product, where the program product includes:

a computer program, the computer program is stored in a readable storage medium, at least one processor of the electronic device can read the computer program from the readable storage medium, and the at least one processor executes the computer program such that the electronic device executes the method described in the first aspect.

The embodiment of the present application has the following advantages or beneficial effects: the present application establishes the simulated unmanned vehicle and the simulation scene, where the simulation scene is used for the simulated unmanned vehicle to perform simulation driving; determines the first sensor solution according to the initialization parameter, and determines the simulation data generated by the simulated unmanned vehicle during the simulation driving in the simulation scene according to the first sensor solution; and determines the first perception parameter of the first sensor solution according to the simulation data, and corrects the first sensor solution according to the first perception parameter, so as to obtain the sensor solution applied to the unmanned vehicle. The method of the present application firstly establishes a simulated unmanned vehicle, a simulation scene and a simulated sensor, and determines the first sensor solution according to the initialization parameter, and then corrects the first sensor solution by using simulation experiment and based on the established simulated unmanned vehicle, simulation scene and simulated sensor to obtain the sensor solution applied to unmanned vehicle. This method fully considers and combines the physical parameter of the sensor, the size of the obstacle, the model size of the unmanned vehicle, and the determined sensor solution applied to the unmanned vehicle has strong perception capability and high perception accuracy, which can better guarantee the safe operation of the unmanned vehicle.

Other effects of the above-mentioned optional methods will be illustrated below in conjunction with specific embodiments.

BRIEF DESCRIPTION OF THE DRAWINGS

The drawings are used for a better understanding of the solution, and do not constitute a limitation to the present application. Where.

DESCRIPTION OF EMBODIMENTS

Exemplary embodiments of the present application are illustrated below in combination with the accompanying drawings, which include various details of the embodiments of the present application to facilitate understanding, which shall be regarded as merely exemplary. Therefore, those of ordinary skilled in the art should realize that various changes and modifications can be made to the embodiments described herein without departing from the scope and spirit of the present application. Likewise, for clarity and conciseness, descriptions of well-known functions and structures are omitted in the following description.

Explanation of terms involved in the present application are:

lidar: a radar system that emits a laser beam to detect a position and velocity, etc. of a target.

point cloud: a collection of point data on surface of a target object obtained by a measuring instrument, which is used to express spatial distribution and surface characteristics of the target object. After the spatial coordinates of each sampling point on the surface of the target object is obtained, the obtained point set constitutes a point cloud.

Application scene of the present application: with the rapid development of unmanned vehicle technology, unmanned vehicles have been more and more widely promoted and applied. During the automatic driving process of the unmanned vehicle, sensors installed on the unmanned vehicle are used to collect sensor data. An unmanned vehicle system formulates an automatic driving solution of the unmanned vehicle and analyzes automatic driving situation of the unmanned vehicle based on collected sensor data. Therefore, the perception capability of sensors installed on the unmanned vehicle is an important factor affecting safe driving of the unmanned vehicle. In the related technology, the sensor data corresponding to obstacles with different sizes at different distances is calculated according to the physical parameters of the sensor, detection distance of the sensor is estimated according to the sensor data, and occlusion of obstacles is estimated according to model size of the unmanned vehicle to determine the sensor solution.

However, only from the physical parameters of the sensor, a sensor designed solution has weak perception capability and low perception accuracy; at the same time, the detection distance accuracy of the sensor estimated only based on the size of the obstacle and the model size of the unmanned vehicles is poor, which is not beneficial to safe operation of the unmanned vehicle.

The method, the device, the equipment and the storage medium for determining the sensor solution provided by the present application aim to solve the above technical problems.

Figure 1:
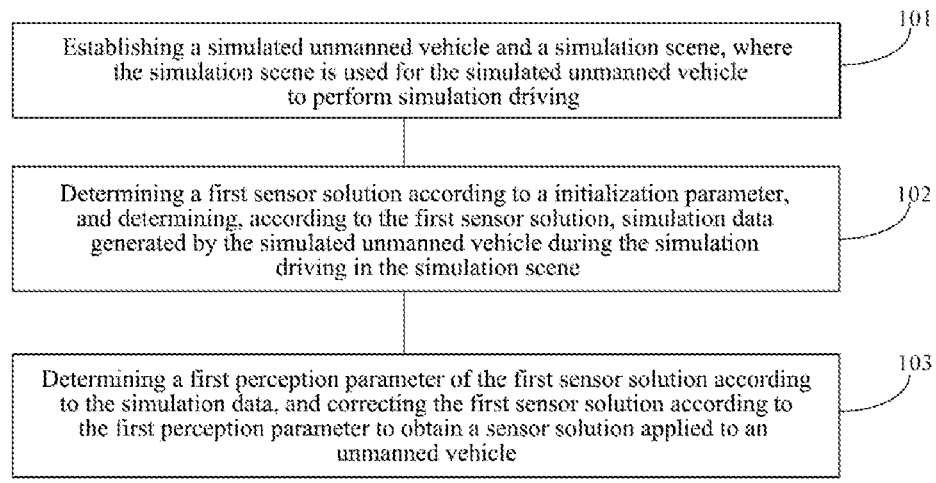
FIG. 1 is a schematic flowchart of a method for determining a sensor solution provided by an embodiment of the present application.

FIG. 1 is a method for determining a sensor solution provided by an embodiment of the present application. As shown in FIG. 1, the method includes:

Step 101: establishing a simulated unmanned vehicle and a simulation scene, where the simulation scene is used for the simulated unmanned vehicle to perform simulation driving.

In this embodiment, specifically, the executive subject of the embodiment is terminal equipment or a server set on the terminal equipment, or a controller, or other devices or equipment that can implement the embodiment. This embodiment takes the executive subject being an application program set on the terminal equipment as an example for illustration.

It is a common method of unmanned vehicle experiment to test the driving capability of unmanned vehicle, optimize the laser radar solution and arrange the camera through simulation experiment. By providing vehicle dynamics simulation model, vehicle running scene visualization, sensor simulation and other series of operations, simulation processing of the unmanned vehicle experiment is realized. The method of establishing a simulated unmanned vehicle includes: driving performance data of a real unmanned vehicle is obtained, and a simulated unmanned vehicle corresponding to the real unmanned vehicle based on the driving performance data is established. Through the vehicle running scene visualization method, the simulation scene of the simulated driving of the unmanned vehicle is established. The simulation scenes include the static simulation scene and the dynamic simulation scene. The static simulation scene is a visual scene composed of environmental information during the simulation driving of the unmanned vehicle, for example, a static scene composed of element models such as roads, houses, green plants, and roadblocks; and the dynamic simulation scene is a visual scene composed of driving behaviors of the unmanned vehicle during the simulation driving, for example, including visual scenes composed of driving behaviors such as following a car on a straight road, overtaking on a straight road, being overtaken on a straight road, and turning at an intersection. The establishment of simulated unmanned vehicle and the simulation scene can be implemented by using existing simulated software, which will not be repeated in the present application.

Step 102: determining a first sensor solution according to a initialization parameter, and determining, according to the first sensor solution, simulation data generated by the simulated unmanned vehicle during the simulation driving in the simulation scene.

In this embodiment, specifically, the first sensor solution includes the models, number and installation position information of sensors. According to the initialization parameters of the sensor solution, the first sensor solution is determined. The initialization parameter can be the installation parameter of the simulated sensor determined according to the simulation experience of the tester or according to the fixed simulation process. A simulated sensor is established and the simulated sensor is installed in the simulation unmanned vehicle according to the models, number and installation location information of the sensors described in the first sensor solution. When the types of simulated sensors are different, the specific content of the first sensor solution may be different.

Figure 1A:
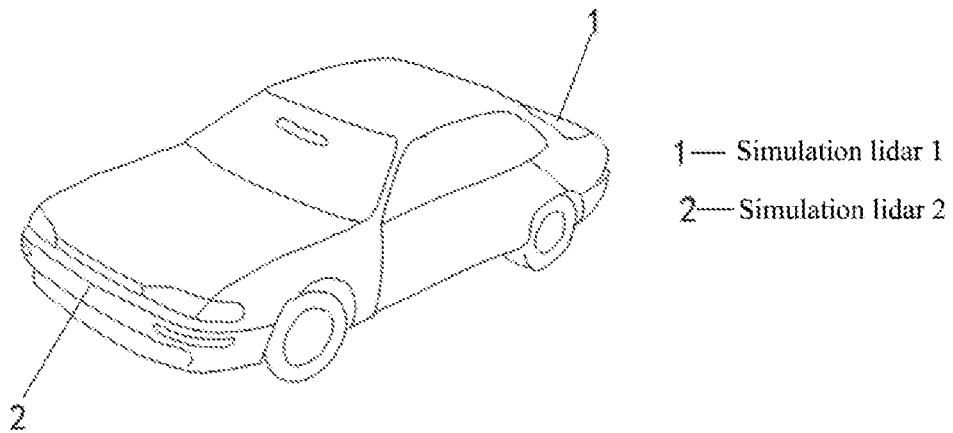
FIG. 1a is a schematic structural diagram of a simulated unmanned vehicle equipped with a simulated lidar provided by an embodiment of the present application.

The sensor includes a lidar and a camera. When the sensor is the lidar, the installation position of the lidar in the unmanned vehicle includes the lidar installed around the unmanned vehicle, and its laser beam is generally less than 8 lines. The common ones are single line lidar and four lines lidar. In addition, it also includes the lidar installed on the top of unmanned vehicle, and its laser beam is generally no less than 16 lines, and the common one is 16/32/64 lines lidar. As an example, as shown in FIG. 1a, the initialization parameters include that the model of lidar is S, the number is two, and the installation position is 40 cm position of the air intake grille of the unmanned vehicle and the position of the rear windshield of the unmanned vehicle.

A lidar is the core component of multi-sensor fusion of unmanned vehicle system. In the solution of automatic driving sensor of L3 and above, multiple lidars are usually required to realize high-precision perception of the environment. In the simulation experiment of the unmanned vehicle, the lidar target simulator is used to carry out the semi-physical simulation of the functions and performance of the lidar to obtain the corresponding simulated lidar. Through the hardware-in-the-loop system and through realistically simulating the actual road scene of the automatic driving of the unmanned vehicle, the role of lidar in an automatic driving assistance system and a high-level intelligent driving system is verified.

After the first lidar solution is determined, the simulated lidar is installed in the simulated unmanned vehicle according to the model, the number, and the installation location information of the lidar described in the first lidar solution. Exemplarily, as shown in FIG. 1a, two simulated lidars with the model S are installed at the 40 cm position of the air intake grille and the position of the rear windshield of the simulated unmanned vehicle. After installing the simulated lidar, the simulated unmanned vehicle is used to drive automatically in the simulation scene, and the simulated lidar installed on the simulated unmanned vehicle scans the simulation scene to obtain the point cloud data corresponding to the simulation scene. That is, the simulation point cloud corresponding to the simulation scene is obtained. Exemplarily, the simulated four lines lidar polls four laser transmitters, and obtains a frame of simulated point cloud after each polling cycle. The four simulated point clouds corresponding to the four laser transmitters can form surface information, and the height information of obstacles can be obtained from the surface information. The distance information of the obstacle is obtained according to the single-frame simulation point cloud, and the differential processing is performed on the distance information according to the coordinates of the multi-frame simulation point cloud to obtain the speed information of the obstacle.

Figure 1B:
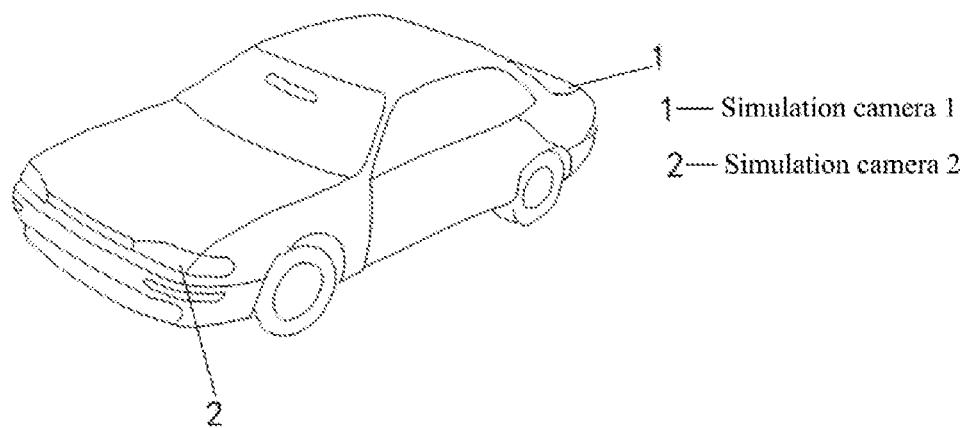
FIG. 1b is a schematic structural diagram of a simulated unmanned vehicle equipped with a simulated camera provided by an embodiment of the present application.

When the sensor is the camera, the installation position of the camera in the unmanned vehicle includes the installing around the unmanned vehicle and the installing on the top of the unmanned vehicle. Its main contribution is detecting and interpreting visual cues, such as a road sign and a position, as well as a curvature of lane markings, to keep the vehicle driving in the correct lane and complete basic lane changing operations. Exemplarily, as shown in FIG. 1b, the initialization parameters include that the camera model is S, the number is two, and the installation positions are above the front headlights and on the rear reversing lights of the unmanned vehicle.

The camera is an important component of the multi-sensor perception system of the unmanned vehicle system. It is a basis of realizing lots of automatic data acquisition system (ADAS) functions with warning and recognition. Among lots of ADAS functions, the visual image processing system is more basic and more intuitive for the driver, and the camera is the basis of the visual image processing system, therefore, the on-board camera is essential for unmanned vehicle driving. Lane departure warning (LDW), forward collision warning (FCW), traffic sign recognition (TSR), lane keeping assist (LKA), pedestrian collision warning (PCW), surround view parking (SVP), driver fatigue warning and many other functions can all be realized by the camera, and some functions can only be realized by the camera. According to the requirements of different ADAS functions, the installation position of the camera is different. According to the different installation positions of the camera, it can be divided into four parts: front view, side view, rear view and built-in. To realize the full set of ADAS functions, a single unmanned vehicle usually needs to install multiple cameras. In the simulation experiment of the unmanned vehicle, the semi-physical simulation of the function and performance of the camera is carried out by using the camera target simulator to obtain the corresponding simulated camera. Through the hardware-in-the-loop system and through realistically simulating the actual road scene of the automatic driving of the unmanned vehicle, the role of the camera in the automatic driving assistance system and the high-level intelligent driving system is verified.

After the first camera solution is determined, the simulated camera is installed in the simulated unmanned vehicle according to the model, the number, and the installation location information of the camera described in the first camera solution. Exemplarily, as shown in FIG. 1b, two simulated cameras with the model S are installed at the positions of the front headlights position and the positions of the rear reversing lights of the simulated unmanned vehicle. After the simulation camera is installed, the simulation unmanned vehicle is used to automatically drive in the simulation scene, and the simulation camera installed on the simulation unmanned vehicle scans the simulation scene to obtain the image corresponding to the simulation scene, that is, the simulation image corresponding to the simulation scene is obtained.

Step 103: determining a first perception parameter of the first sensor solution according to the simulation data, and correcting the first sensor solution according to the first perception parameter to obtain a sensor solution applied to an unmanned vehicle.

In this embodiment, specifically, the first perception parameter of the first sensor solution is determined based on the simulation data generated by the simulated unmanned vehicle during the automatically driving in the simulation scene. The first perception parameter includes information such as detection range, detection stability, detection accuracy, and detection speed. The first perception parameter is a numerical representation of the perception capability of the first sensor solution. The simulation data is input into the preset sensor perception algorithm to obtain the first perception parameter of the first sensor solution represented by the simulation data. According to the preset sensor perception capability requirements and the first perception parameter of the first sensor solution, the first sensor solution is corrected to obtain a corrected sensor solution that meets the preset sensor perception capability requirements. The corrected sensor solution is a sensor solution suitable for the unmanned vehicle. The preset sensor perception capability requirement is a numerical representation of the perception capability requirement of the preset sensor solution, which specifically includes the preset requirement values of multiple parameters such as detection range, detection stability, detection accuracy, and detection speed. According to the difference between the first perception parameter and the corresponding parameter values in the preset sensor perception capability requirements, the first sensor solution is corrected to obtain a sensor solution suitable for the unmanned vehicle that meets the preset requirements.

In this embodiment, a simulated unmanned vehicle and a simulation scene are established, where the simulation scene is used for the simulated unmanned vehicle to perform simulation driving; the first sensor solution is determined according to the initialization parameter, and according to the first sensor solution, the simulation data generated by the simulated unmanned vehicle during the simulation driving in the simulation scene is determined; and according to the simulation data, the first perception parameter of the first sensor solution is determined, and according to the first perception parameter, the first sensor solution is corrected to obtain the sensor solution applied to the unmanned vehicle. This embodiment determines the first sensor solution according to the initialization parameter by establishing the simulation unmanned vehicle, the simulation scene and the simulated sensor, and corrects the first sensor solution according to the first perception parameter by acquiring the simulation data obtained by the simulated unmanned vehicle during the driving and determining the first perception parameter represented by the simulation data to obtain the sensor solution applied to the unmanned vehicle. Since the first perception parameter is determined by the first sensor solution, the physical parameters of the sensor, the obstacle size and motion morphology, the model size of the unmanned vehicle and other factors etc., the first sensor solution is corrected according to the first perception parameter. The correction process of the sensor solution fully considers the physical parameters of the sensor, the size and motion morphology of the obstacle, the model size of the unmanned vehicle and other factors. Therefore, the determined sensor solution applied to the unmanned vehicle has strong perception capability and high perception accuracy, which can better guarantee the safe operation of the unmanned vehicle.

Figure 2:
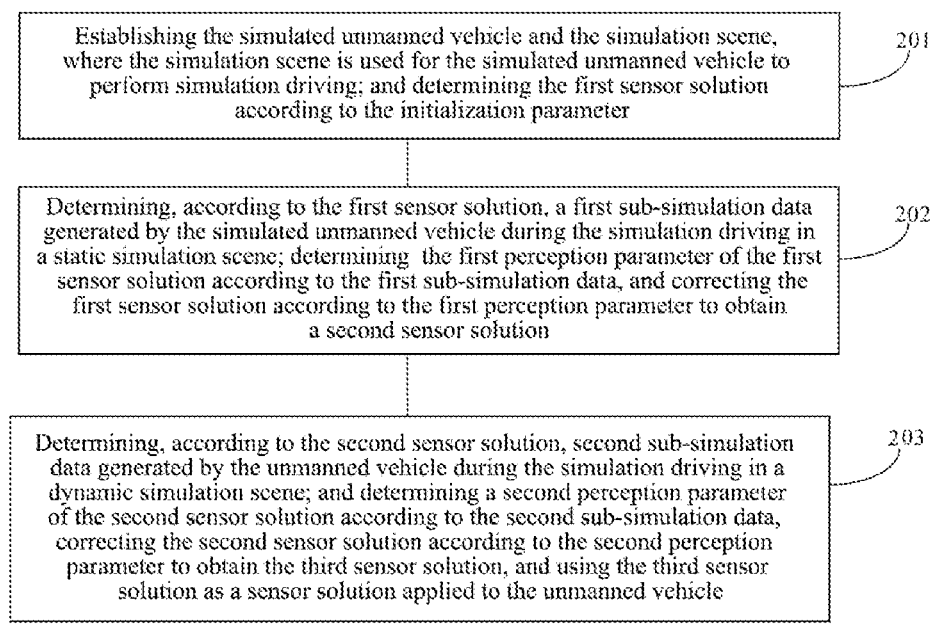
FIG. 2 is a schematic flowchart of another method for determining a sensor solution provided by an embodiment of the present application.

FIG. 2 is another method for determining a sensor solution provided by an embodiment of the present application. Based on FIG. 1, as shown in FIG. 2:

Step 201: establishing the simulated unmanned vehicle and the simulation scene, where the simulation scene is used for the simulated unmanned vehicle to perform simulation driving; and determining the first sensor solution according to the initialization parameter.

The method and principle of step 201 are similar or the same as those of step 101 and step 102, please refer to the record of step 101 and step 102, which will not be repeated in this embodiment.

Step 202: determining, according to the first sensor solution, a first sub-simulation data generated by the simulated unmanned vehicle during the simulation driving in a static simulation scene; determining the first perception parameter of the first sensor solution according to the first sub-simulation data, and correcting the first sensor solution according to the first perception parameter to obtain a second sensor solution.

In this embodiment, specifically, the static simulation scene may be a visualization scene composed of environmental information when the unmanned vehicle is driving. For example, static simulation scenes include visual scenes composed of element models such as roads, houses, green plants, or roadblocks. According to the first sensor solution, the simulated sensor is installed in the unmanned vehicle. When the simulated unmanned vehicle automatically drives in the static simulation scene, the simulated sensor scans the static simulation scene to obtain the first sub-simulation data. The first sub-simulation data reflects the static simulation scene perceived by the simulated sensor under the first sensor solution, but the static simulation scene perceived by the simulated sensor is not completely consistent with the real static simulation scene. Therefore, the first sensor solution needs to be corrected according to the first sub-simulation data to obtain the second sensor solution.

According to the first sensor solution, the simulated sensor is installed in the simulated unmanned vehicle, and the simulated unmanned vehicle is used to perform simulated driving in the static simulation scene. The first sub-simulation data generated by the unmanned vehicle during the simulation driving is input into a preset sensor perception algorithm to obtain the first perception parameter represented by the first sub-simulation data. The first perception parameter is a numerical representation of the perception capability of the first sensor solution, and the first perception parameter includes information such as detection range, detection stability, detection accuracy, and detection speed. According to the first perception parameter and the preset sensor perception capability requirements, the first sensor solution is corrected to obtain the second sensor solution. Specifically, when the first perception parameter does not meet the preset sensor perception capability requirements, the number, the model, and the installation position of the sensor are adjusted to obtain the adjusted second sensor solution.

A lidar is the core component of the unmanned vehicle perception system. Lidar solutions usually involve multiple lidars. The installation solution of multiple lidars is an important factor in determining the perception capability of lidar, and good lidar perception capability is an important factor to guarantee the safe driving of the unmanned vehicle. In this embodiment, the first lidar solution is determined according to the initialization parameter of the lidar, where the initialization parameter can be determined based on the experience of those skilled in the art, or based on theoretical knowledge, basic requirements, etc. in the field.

When the sensor is a lidar, the sensor data generated by the simulated unmanned vehicle during the driving in the simulation scene is point cloud data, and the method of obtaining point cloud data can be implemented by using an existing method, which will not be repeated here. The first sub-simulation point cloud is generated by the simulated unmanned vehicle during the driving in the static simulation scene, and the first sub-simulation point cloud is input into the preset point cloud perception algorithm to obtain the first perception parameter represented by the first sub-simulation point cloud. The first perception parameter describes the detection range, detection stability, detection accuracy, detection speed and other information of the lidar. According to the first perception parameter and the preset lidar perception requirement, when the first perception parameter does not meet the preset lidar perception requirement, the first lidar solution is corrected. Specifically, the number, the model, and the installation location of the lidar are adjusted to obtain the adjusted second lidar solution.

The camera is also the core component of the unmanned vehicle perception system. When the sensor is a camera, the sensor data generated by the simulated unmanned vehicle during the driving in the simulation scene is image data. The first sub simulation image is generated by the simulated unmanned vehicle during the driving in the static simulation scene, and the first sub simulation image is input into the preset image perception algorithm to obtain the first perception parameter represented by the first sub simulation image; and according to the first perception parameters and the preset camera perception requirements, the first camera solution is corrected to obtain the second camera perception solution.

For ease of description, assuming that the first sensor solution in this embodiment is $a_1x_1+b_1y_1+c_1=0$, where $a_1$ represents the model parameter of the simulated sensor, $b_1$ represents the number parameter of the simulated sensor, $c_1$ represents the installation location parameter of the simulated sensor, $x_1$ represents the variable corresponding to the simulation scene, and $y_1$ represents the first perception parameter of the first sensor solution.

In order to facilitate the distinction, in the following description, $y_1$ is used to represent the first perception parameter of the first sensor solution, and $y_2$ is used to represent the second perception parameter of the second sensor solution. According to the foregoing analysis, the perception parameter represented by the first sub-simulation data is the first perception parameter $y_1$; and the second perception parameter $y_2$ is determined according to the preset sensor perception capability requirements. In the first sensor solution $a_1 x_1+b_1y_1+c_1=0$, $x_1$ represents the variable corresponding to the simulation scene. For a certain simulation scene, the corresponding variable is known and remains unchanged. Therefore, it only needs to replace the first perception parameter $y_1$ in $a_1x_1+b_1y_1+c_1=0$ with the second perception parameter $y_2$, and use single factor control experiments to determine the model parameter $a_2$ of the simulated sensor, the number parameter $b_2$ of the simulated sensor, and the installation position parameter $c_2$ of the simulated sensor in the second sensor solution, thus, the second sensor solution is obtained as $a_2x_2+b_2y_2+c_2=0$. Among them, the single factor control experiment is a conventional experimental method in the field, and this embodiment will not be repeated here.

When the sensor is the lidar or the camera, the process and principle that the first sensor solution is adjusted according to the first perception parameter to obtain the second sensor solution are the same as the above description, which will not be repeated here.

Step 203: determining, according to the second sensor solution, second sub-simulation data generated by the unmanned vehicle during the simulation driving in a dynamic simulation scene; and determining a second perception parameter of the second sensor solution according to the second sub-simulation data, correcting the second sensor solution according to the second perception parameter to obtain the third sensor solution, and using the third sensor solution as a sensor solution applied to the unmanned vehicle.

In this embodiment, specifically, the simulation scene for simulating the driving of the unmanned vehicle includes a static simulation scene as well as a dynamic simulation scene. The dynamic simulation scene includes at least one dynamic sub-simulation scene. Dynamic sub-simulation scenes can be various driving dynamic scenes that the unmanned vehicle may experience during the driving. For example, it can be a driving dynamic scene such as following the car in a straight lane, overtaking in a straight lane, being overtaken in a straight lane, going straight at an intersection, or turning at an intersection, etc.

Since the determined sensor solution applied to unmanned vehicles needs to be suitable for multiple dynamic sub-simulation scenes, at least one second sub-simulation data generated by the simulated unmanned vehicle during the simulating driving in at least one dynamic sub-simulation scene is determined, each second sub-simulation data in the at least one second sub-simulation data can represent the perception capability of the second sensor solution in the corresponding dynamic sub-simulation scene. At least one second sub-simulation data is input into the preset sensor perception algorithm to obtain the second perception parameter of the second sensor solution. The second perception parameter is calculated based on at least one second sub-simulation data, which reflects the comprehensive perception capability of the second sensor solution in multiple dynamic sub-simulation scenes. Specifically, the second perception parameter is a numerical representation of the comprehensive perception capability of the second sensor solution. According to the difference between the second perception parameter and the preset sensor perception capability requirement, the number, the model and the installation position of the sensor in the second sensor solution are adjusted. The second sensor solution is the determined sensor solution of the simulated unmanned vehicle in the static simulation scene. According to the second sub-simulation data generated by the simulation unmanned vehicle during the driving in the dynamic simulation scene, the second sensor solution is continuously optimized and adjusted to obtain the third sensor solution suitable for the dynamic simulation scene.

The second sub-simulation data reflects the dynamic simulation scene perceived by the simulated sensor under the second sensor solution. The second sub-simulation data is used to correct the second sensor solution, improve the perception capability of the second sensor solution, and obtain the third sensor solution, which can make the dynamic simulation scene perceived by the simulated sensor under the third sensor solution consistent with the real dynamic simulation scene as much as possible. The method and principle of correcting the second sensor solution to obtain the third sensor solution are similar or the same as those of correcting the first sensor solution to obtain the second sensor perception solution in step 202. Referring to the relevant records in step 202, and this embodiment will not be repeated here.

The third sensor solution is a sensor solution that can be applied to the actual unmanned vehicle. In the third sensor solution, the model, the number, and the installation location of the simulated sensor installed on the simulated unmanned vehicle are the model, the number, and the installation location of the sensor installed in the actual unmanned vehicle. The simulation data is obtained by using the simulated unmanned vehicle during the driving in the simulation scene, the simulation data is used to continuously correct the sensor solution, and finally a sensor solution suitable for the actual unmanned vehicle is obtained. During the correction process of the sensor solution, the actual driving environment of the unmanned vehicle, the physical parameters of the sensor, the size and appearance of the unmanned vehicle, the morphology of the obstacles and the movement characteristics are fully considered. On the basis of effectively controlling the correction cost of the sensor solution, the perception accuracy and perception capability of the sensor solution are guaranteed, which is beneficial to guarantee the safe operation of the unmanned vehicle.

The embodiment establishes a simulation unmanned vehicle and a simulation scene, where the simulation scene is used for the simulated unmanned vehicle to perform simulation driving; determines the first sensor solution according to the initialization parameter; determines, according to the first sensor solution, the first sub-simulation data generated by the unmanned vehicle during the simulation driving in the static simulation scene; determines, according to the first sub-simulation data, the first perception parameter of the first sensor solution and corrects the first sensor solution according to the first perception parameter to obtain the second sensor solution; determines, according to the second sensor solution, the second sub-simulation point cloud generated by the unmanned vehicle during the simulation driving in the dynamic simulation scene; and determines, according to the second sub-simulation point cloud, the second perception parameter of the second sensor solution, corrects the second sensor solution according to the second perception parameter to obtain the third sensor solution, and uses the third sensor solution as a sensor solution applied to the unmanned vehicle. In the method of this embodiment, in the process of using the simulation experiment to correct the sensor solution, the first sub-simulation data collected by the simulated sensor in the static simulation scene is used to correct the first sensor solution, and the second sub-simulation data collected by the simulated sensor in the dynamic simulation scene is used to correct the second sensor solution, which fully consider the various static scenes and dynamic scenes that the unmanned vehicle may experience in the actual driving process, the determined sensor solution applied to the unmanned vehicle is more suitable for the actual driving process requirements of the unmanned vehicle, and the perception capability and the perception accuracy of the sensor solution are more suitable for the various scenes that the unmanned vehicle may experience in the actual driving process. Therefore, the sensor solution applied to the unmanned vehicle determined by this method is more beneficial to guarantee the safe operation of the unmanned vehicle. Since the perception parameters of the sensor solution are influenced by the physical parameters of the sensor, the size of the obstacle, the size of the unmanned vehicle and other factors, by correcting the sensor solution according to the perception parameter, the determined sensor solution has high perception accuracy and strong perception capability, which is beneficial to guarantee the safe operation of the unmanned vehicle.

Figure 3:
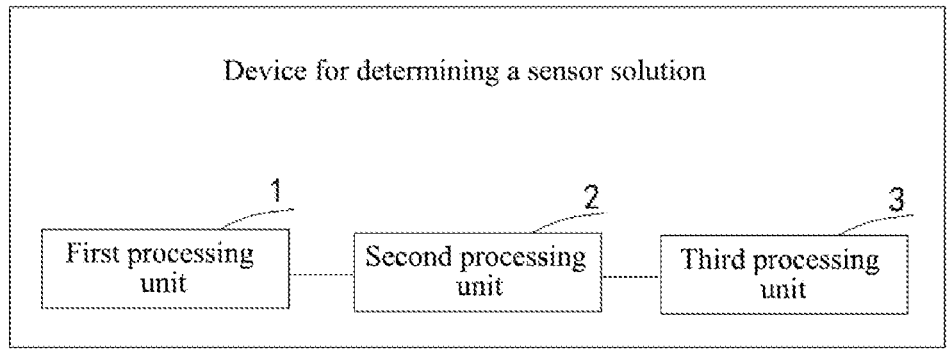
FIG. 3 is a schematic structural diagram of a device for determining a sensor solution provided by an embodiment of the present application.

FIG. 3 is a schematic structural diagram of a device for determining a sensor solution provided by an embodiment of the present application. As shown in FIG. 3, the device includes:
a first processing unit 1, configured to establish a simulated unmanned vehicle and a simulation scene, where the simulation scene is used for the simulated unmanned vehicle to perform simulation driving;
a second processing unit 2, configured to determine a first sensor solution according to a initialization parameter, and determine, according to the first sensor solution, simulation data generated by the simulation unmanned vehicle during the simulation driving in the simulation scene; and
a third processing unit 3, configured to determine a first perception parameter of the first sensor solution according to the simulation data and correct the first sensor solution according to the first perception parameter to obtain a sensor solution applied to an unmanned vehicle.

In this embodiment, a simulated unmanned vehicle and a simulation scene are established, where the simulation scene is used for the simulated unmanned vehicle to perform simulation driving; the first sensor solution is determined according to the initialization parameter, and according to the first sensor solution, the simulation data generated by the simulated unmanned vehicle during the simulation driving in the simulation scene is determined; and according to the simulation data, the first perception parameter of the first sensor solution is determined, and according to the first perception parameter, the first sensor solution is corrected to obtain the sensor solution applied to the unmanned vehicle. This embodiment determines the first sensor solution according to the initialization parameter by establishing the simulation unmanned vehicle, the simulation scene and the simulated sensor, and corrects the first sensor solution according to the first perception parameter by acquiring the simulation data obtained by the simulated unmanned vehicle during the driving and determining the first perception parameter represented by the simulation data to obtain the sensor solution applied to the unmanned vehicle. Since the first perception parameter is determined by the first sensor solution, the physical parameters of the sensor, the obstacle size and the model size of the unmanned vehicle, the first sensor solution is corrected according to the first perception parameter. The correction process of the sensor solution fully considers the influence of the physical parameters of the sensor, the size of the obstacle and the model size of the unmanned vehicle. Therefore, the determined sensor solution applied to the unmanned vehicle has strong perception capability and high perception accuracy, which can better guarantee the safe operation of the unmanned vehicle.

Figure 4:
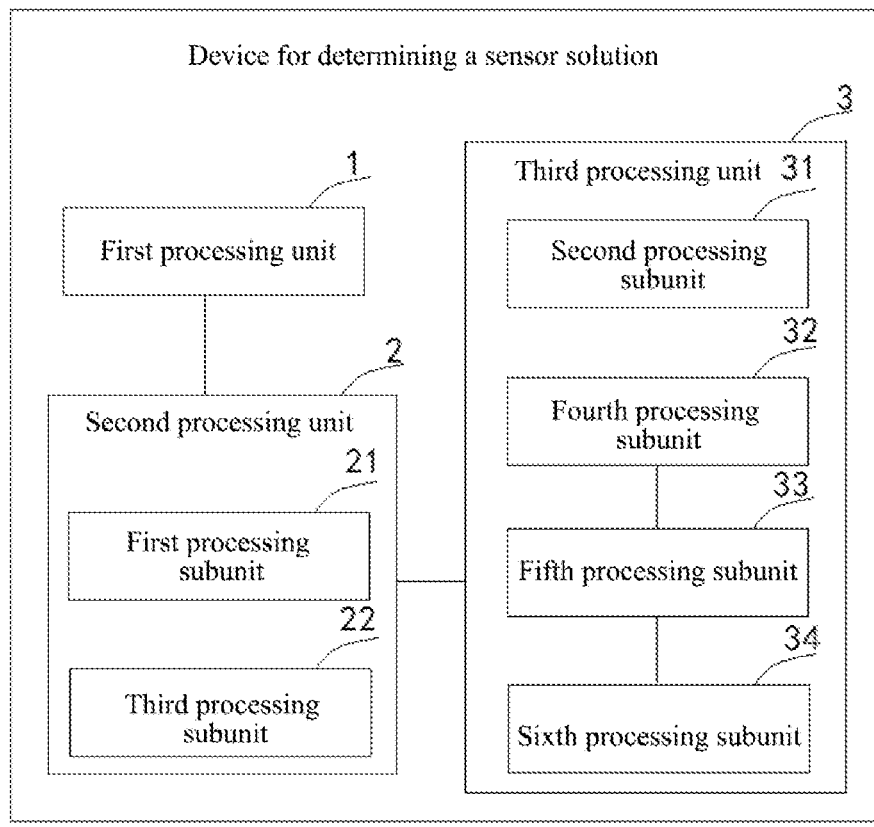
FIG. 4 is a schematic structural diagram of another device for determining a sensor solution provided by an embodiment of the present application.

FIG. 4 is a schematic structural diagram of another device for determining a sensor solution provided by an embodiment of the present application. On the basis of FIG. 3, as shown in FIG. 4,
the simulation scene includes a static simulation scene, and the second processing unit 2 includes:
a first processing subunit 21, configured to determine, according to the first sensor solution, a first sub-simulation data generated by the simulated unmanned vehicle during the simulation driving in the static simulation scene; and
the third processing unit 3 includes:

a second processing subunit 31, configured to determine the first perception parameter of the first sensor solution according to the first sub-simulation data, and correct the first sensor solution according to the first perception parameter to obtain the sensor solution applied to the unmanned vehicle.

The simulation scene includes a static simulation scene and a dynamic simulation scene. The dynamic simulation scene includes at least one dynamic sub-simulation scene; and the second processing unit 2 includes:
a third processing subunit 22, configured to determine, according to the first sensor solution, first sub-simulation data generated by the simulated unmanned vehicle during the simulation driving in the static simulation scene;
the third processing unit 3 includes:
a fourth processing subunit 32, configured to determine the first perception parameter of the first sensor solution according to the first sub-simulation data; and correct the first sensor solution according to the first perception parameter to obtain a second sensor solution;
a fifth processing subunit 33, configured to determine, according to the second sensor solution, at least one second sub-simulation data generated by the simulated unmanned vehicle during the simulation driving in the at least one dynamic sub-simulation scene; and
a sixth processing subunit 34, configured to determine a second perception parameter of the second sensor solution according to each second sub-simulation data of the at least one second sub-simulation data, correct, according to the second perception parameter, the second sensor solution to obtain a third sensor solution, and use the third sensor solution as the sensor solution applied to the unmanned vehicle.

The second processing unit 2 includes:
a seventh processing subunit 23, configured to establish a simulated sensor, and install the simulated sensor in a simulated unmanned vehicle according to the first sensor solution; and
an eighth processing subunit 24, configured to determine the simulation data generated by the simulated unmanned vehicle installed with the simulated sensor during the simulation driving in the simulation scene.

The third processing unit 3 includes:
a ninth processing subunit 35, configured to input the simulation data into a preset sensor perception algorithm to obtain a first perception parameter represented by the simulation data; and
a tenth processing subunit 36, configured to correct, according to the first perception parameter and preset sensor perception capability requirement, the first sensor solution to obtain the sensor solution applied to the unmanned vehicle.

The Sensor includes a lidar and a camera.

The sensor solution includes one or more of the following: sensor model, number of sensors, and sensor installation location.

The embodiment establishes a simulation unmanned vehicle and a simulation scene, where the simulation scene is used for the simulated unmanned vehicle to perform simulation driving; determines the first sensor solution according to the initialization parameter; determines, according to the first sensor solution, the first sub-simulation data generated by the unmanned vehicle during the simulation driving in the static simulation scene; determines, according to the first sub-simulation data, the first perception parameter of the first sensor solution and corrects the first sensor solution according to the first perception parameter to obtain the second sensor solution; determines, according to the second sensor solution, the second sub-simulation point cloud generated by the unmanned vehicle during the simulation driving in the dynamic simulation scene; and determines, according to the second sub-simulation point cloud, the second perception parameter of the second sensor solution, corrects the second sensor solution according to the second perception parameter to obtain the third sensor solution, and uses the third sensor solution as a sensor solution applied to the unmanned vehicle. In the method of this embodiment, in the process of using the simulation experiment to correct the sensor solution, the first sub-simulation data collected by the simulated sensor in the static simulation scene is used to correct the first sensor solution, and the second sub-simulation data collected by the simulated sensor in the dynamic simulation scene is used to correct the second sensor solution, which fully consider the various static scenes and dynamic scenes that the unmanned vehicle may experience in the actual driving process, the determined sensor solution applied to the unmanned vehicle is more suitable for the actual driving process requirements of the unmanned vehicle, and the perception capability and the perception accuracy of the sensor solution are more suitable for the various scenes that the unmanned vehicle may experience in the actual driving process. Therefore, the sensor solution applied to the unmanned vehicle determined by this method is more beneficial to guarantee the safe operation of the unmanned vehicle. Since the perception parameters of the sensor solution are influenced by the physical parameters of the sensor, the size of the obstacle, the size of the unmanned vehicle and other factors, by correcting the sensor solution according to the perception parameter, the determined sensor solution has high perception accuracy and strong perception capability, which is beneficial to guarantee the safe operation of the unmanned vehicle.

According to the embodiment of the present application, the present application also provides electronic equipment and a readable storage medium.

Figure 5:
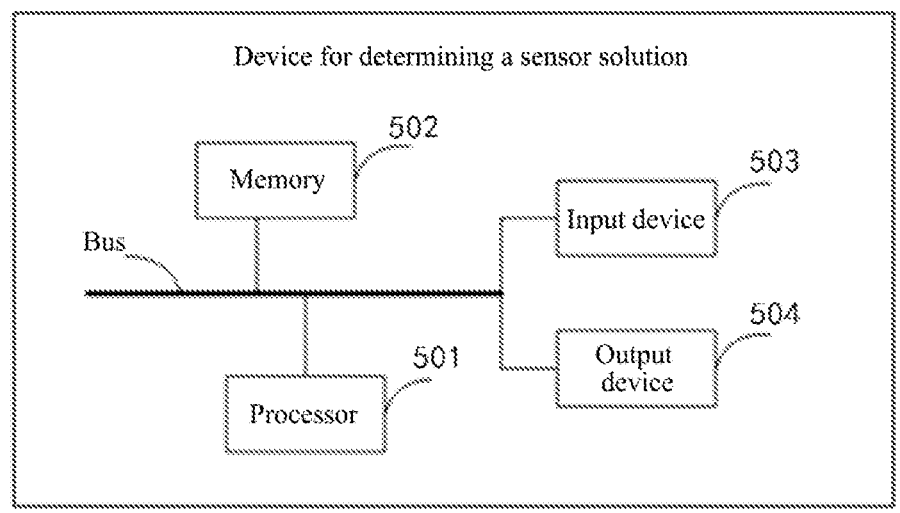
FIG. 5 is a schematic structural diagram of equipment for determining a sensor solution provided by an embodiment of the present application.

As shown in FIG. 5, it is a block diagram of electronic equipment according to the method for determining a sensor solution in the embodiment of the present application. Electronic equipment is intended to represent various forms of digital computers, such as a laptop computer, a desktop computer, a workstation, a personal digital assistant, a server, a blade server, a mainframe computer, and other suitable computers. Electronic equipment can also represent various forms of mobile devices, such as personal digital processing, a cellular phone, a smart phone, wearable equipment, and other similar computing devices. The components shown herein, their connections and relationships, and their functions are merely examples, and are not intended to limit the implementation of the present application described and/or required herein.

As shown in FIG. 5, the electronic equipment includes: one or more processors 501, a memory 502, and interfaces for connecting various components which includes a high-speed interface and a low-speed interface. The various components are connected to each other by using different buses, and can be installed on a common motherboard or installed in other ways as required. The processor may process instructions executed in the electronic equipment, which includes instructions stored in or on the memory to display graphical information of the graphical user interface (GUI) on an external input/output device (such as display equipment coupled to the interface). In other implementations, multiple processors and/or multiple buses may be used with multiple memories if necessary. Similarly, multiple electronic equipment can be connected, and each equipment provides some necessary operations (for example, as a server array, a group of blade servers, or a multi-processor system). In FIG. 5, a processor 501 is taken as an example.

The memory 502 is the non-transitory computer-readable storage medium provided by the present application. Where the memory stores instructions that can be executed by at least one processor, so that the at least one processor executes the method for determining the sensor solution provided in the present application. The non-transitory computer-readable storage medium of the present application stores computer instructions, and the computer instructions are used to make the computer execute the method for determining the sensor solution provided in the present application.

As a non-transitory computer-readable storage medium, the memory 502 can be used to store non-transitory software programs, non-transitory computer-executable programs, and modules, such as the program instructions/modules corresponding to the method for determining the sensor solution in the embodiment of the present application (for example, the acquisition unit 1, the first processing unit 2, and the second processing unit 3 shown in FIG. 3). The processor 501 executes various functional applications and data processing of the server by running non instantaneous software programs, instructions and modules stored in the memory 502, that is, implements the method for determining the sensor solution in the foregoing method embodiment.

The memory 502 may include a storage program area and a storage data area, where the storage program area can store an operating system and an application program required by at least one function; and the storage data area can store data created by the use of electronic equipment determined according to the sensor solution, etc. In addition, the memory 502 may include a high-speed random access memory, and may also include a non-transitory memory, such as at least one magnetic disk storage component, a flash memory component, or other non-transitory solid-state storage components. In some embodiments, the memory 502 may optionally include a memory set remotely relative to the processor 501, which may be connected, through the network, to the electronic equipment determined by the sensor solution. Examples of the aforementioned networks include, but are not limited to, the Internet, corporate intranets, local area networks, mobile communication networks, and combinations thereof.

The electronic equipment of the method for determining the sensor solution may also include: an input device 503 and an output device 504. The processor 501, the memory 502, the input device 503, and the output device 504 may be connected by a bus or other methods. In FIG. 5, the connection by a bus is taken as an example.

The input device 503 can receive input numeric or character information, and generate key signal input related to the user settings and function control of the electronic equipment determined by the sensor solution, such as a touch screen, a keypad, a mouse, a trackpad, a touchpad, a pointer, one or more mouse buttons, a trackball, a joystick and other input devices. The output device 504 may include a display equipment, an auxiliary lighting device (for example, LED), a tactile feedback device (for example, a vibration motor), and the like. The display equipment may include, but is not limited to, a liquid crystal display (LCD), a light emitting diode (LED) display, and a plasma display. In some embodiments, the display plasma may be a touch screen.

Various implementations of the systems and technologies described herein can be implemented in a digital electronic circuit system, an integrated circuit system, an application specific ASIC (application specific integrated circuit), computer hardware, firmware, software, and/or combinations thereof. These various embodiments may include: being implemented in one or more computer programs, the one or more computer programs may be executed and/or interpreted on a programmable system including at least one programmable processor, The programmable processor may be a dedicated or general programmable processor, which can receive data and instructions from a storage system, at least one input device, and at least one output device, and transmit data and instructions to the storage system, the at least one input device, and the at least one output device.

According to the embodiment of the present application, the present application also provides a computer program product, where the program product includes: a computer program, the computer program is stored in a readable storage medium, at least one processor of the electronic device can read the computer program from a readable storage medium, and at least one processor executes the computer program such that the electronic device executes the solution provided by any of the foregoing embodiments.

These calculation programs (also called programs, software, software applications, or codes) include machine instructions for programmable processors, and can utilize high-level procedures and/or object-oriented programming languages, and/or assembly/machine language to implement these calculation procedures. As used herein, the terms "machine-readable medium" and "computer-readable medium" refer to any computer program product, equipment, and/or device used to provide machine instructions and/or data to a programmable processor (for example, magnetic disks, optical disks, memory, programmable logic devices (PLD)), which includes a machine-readable medium that receives machine instructions as machine-readable signals. The term "machine-readable signal" refers to any signal used to provide machine instructions and/or data to a programmable processor.

In order to provide interaction with an user, the system and technology described here can be implemented on a computer. The computer has a display device for displaying information to the user (for example, CRT (Cathode Ray Tube) or LCD (Liquid Crystal Display) monitor); and a keyboard and a pointing device (for example, a mouse or a trackball), where the user can provide input to the computer through the keyboard and the pointing device. Other types of devices can also be used to provide interaction with the user. For example, the feedback provided to the user can be any form of sensory feedback (for example, visual feedback, auditory feedback, or tactile feedback); and the input from the user can be received by any form (including acoustic input, voice input, or tactile input).

The systems and technologies described here can be implemented in a computing system that includes back-end components (for example, as a data server), or a computing system that includes middleware components (for example, an application server), or a computing system that includes front-end components (for example, a user computer with a graphical user interface or a web browser through which the user can interact with the implementation of the system and technology described here), or a computing system that includes any combination of such back-end components, middleware components, and front-end components. The components of the system can be connected to each other through any form or medium of digital data communication (for example, a communication network). Examples of communication networks include: local area network (LAN), wide area network (WAN), and the Internet.

Computer systems can include a client and a server. The client and server are generally far away from each other and usually interact through a communication network. The client and server are generally far away from each other and usually interact through a communication network. The relationship between the client and the server is generated by running computer programs that have a client-server relationship with each other on the corresponding computer.

In the embodiments of the present application, the above embodiments can refer to and learn from each other, and the same or similar steps and terms will not be repeated one by one.

It should be understood that steps can be reordered, added, or deleted by using the various forms of processes shown above. For example, the steps described in the present application can be performed in parallel, sequentially, or a different order, as long as the desired result of the technical solution disclosed in the present application can be achieved, which is not limited herein.

The above specific implementations do not constitute a limitation on the protection scope of the present application. Those skilled in the art should understand that various modifications, combinations, sub-combinations, and substitutions can be made according to design requirements and other factors. Any amendments, equivalent substitutions and improvements made within the spirit and principles of the present application shall be included in the protection scope of the present application.

What is claimed is:

1. A method for determining a sensor solution, applied to terminal equipment, comprising:

establishing a simulated unmanned vehicle and a simulation scene, wherein the simulation scene is used for the simulated unmanned vehicle to perform simulation driving;

determining a first sensor solution according to a initialization parameter, and determining, according to the first sensor solution, simulation data generated by the simulated unmanned vehicle during the simulation driving in the simulation scene; and determining a first perception parameter of the first sensor solution according to the simulation data, and correcting the first sensor solution according to the first perception parameter to obtain a sensor solution applied to an unmanned vehicle for operation of the unmanned vehicle;

wherein the simulation scene comprises a static simulation scene and a dynamic simulation scene, and the dynamic simulation scene comprises at least one dynamic sub-simulation scene; and the determining, according to the first sensor solution, the simulation data generated by the simulated unmanned vehicle during the simulation driving in the simulation scene comprises:

determining, according to the first sensor solution, a first sub-simulation data generated by the simulated unmanned vehicle during the simulation driving in the static simulation scene;

the determining the first perception parameter of the first sensor solution according to the simulation data, and correcting the first sensor solution according to the first perception parameter to obtain the sensor solution applied to the unmanned vehicle for the operation of the unmanned vehicle comprises:
  determining the first perception parameter of the first sensor solution according to the first sub-simulation data, and correcting the first sensor solution according to the first perception parameter to obtain a second sensor solution;
  determining, according to the second sensor solution, at least one second sub-simulation data generated by the simulated unmanned vehicle during the simulation driving in the at least one dynamic sub-simulation scene; and
  determining a second perception parameter of the second sensor solution according to each second sub-simulation data of the at least one second sub-simulation data, correcting the second sensor solution according to the second perception parameter to obtain a third sensor solution, and using the third sensor solution as the sensor solution applied to the unmanned vehicle for the operation of the unmanned vehicle.

2. The method according to claim 1, wherein the determining, according to the first sensor solution, the simulation data generated the simulated unmanned vehicle during the simulation driving in the simulation scene comprises:
  establishing a simulated sensor, and installing the simulated sensor in the simulation unmanned vehicle according to the first sensor solution; and
  determining the simulation data generated by the simulated unmanned vehicle installed with the simulated sensor during the simulation driving in the simulation scene.

3. The method according to claim 1, wherein the determining the first perception parameter of the first sensor solution according to the simulation data and correcting the first sensor solution according to the first perception parameter to obtain the sensor solution applied to the unmanned vehicle for the operation of the unmanned vehicle comprises:
  inputting the simulation data into a preset sensor perception algorithm to obtain the first perception parameter presented by the simulation data; and
  correcting, according to the first perception parameter and preset sensor perception capability requirement, the first sensor solution to obtain the sensor solution applied to the unmanned vehicle for the operation of the unmanned vehicle.

4. The method according to claim 1, wherein the sensor comprises a lidar and a camera.

5. The method according to claim 1, wherein the sensor solution comprises one or more of the following:
  sensor model, number of sensors, and sensor installation location.

6. A device for determining a sensor solution, applied to terminal equipment, comprising:
  at least one processor; and
  a memory communicatively connected with the at least one processor; wherein,
  the memory stores instructions executable by the at least one processor, and the instructions, when executed by the at least one processor, cause the at least one processor to: establish a simulated unmanned vehicle and a simulation scene, wherein the simulation scene is used for the simulated unmanned vehicle to perform simulation driving;
  determine a first sensor solution according to a initialization parameter, and determine, according to the first sensor solution, simulation data generated by the simulation unmanned vehicle during the simulation driving in the simulation scene; and
  determine a first perception parameter of the first sensor solution according to the simulation data and correct the first sensor solution according to the first perception parameter to obtain a sensor solution applied to an unmanned vehicle for operation of the unmanned vehicle;
  wherein the simulation scene comprises a static simulation scene and a dynamic simulation scene, and the dynamic simulation scene comprises at least one dynamic sub-simulation scene; and the instructions further cause the at least one processor to:
  determine, according to the first sensor solution, first sub-simulation data generated by the simulated unmanned vehicle during the simulation driving in the static simulation scene;
  determine the first perception parameter of the first sensor solution according to the first sub-simulation data, and correct the first sensor solution according to the first perception parameter to obtain a second sensor solution;
  determine, according to the second sensor solution, at least one second sub-simulation data generated by the simulated unmanned vehicle during the simulation driving in the at least one dynamic sub-simulation scene; and
  determine a second perception parameter of the second sensor solution according to each second sub-simulation data of the at least one second sub-simulation data, correct, according to the second perception parameter, the second sensor solution to obtain a third sensor solution, and use the third sensor solution as the sensor solution applied to the unmanned vehicle for the operation of the unmanned vehicle.

7. The device according to claim 6, wherein the instructions further cause the at least one processor to: establish a simulated sensor, and install the simulated sensor in the simulation unmanned vehicle according to the first sensor solution; and
  determine the simulation data generated by the simulated unmanned vehicle installed with the simulated sensor during the simulation driving in the simulation scene.

8. The device according to claim 6, wherein the instructions further cause the at least one processor to:
  input the simulation data into a preset sensor perception algorithm to obtain a first perception parameter represented by the simulation data; and
  correct, according to the first perception parameter and preset sensor perception capability requirement, the first sensor solution to obtain the sensor solution applied to the unmanned vehicle for the operation of the unmanned vehicle.

9. The device according to claim 6, wherein the sensor comprises a lidar and a camera.

10. The device according to claim 6, wherein the sensor solution comprises one or more of the following:
  sensor model, number of sensors, and sensor installation location.

11. A non-transitory computer readable storage medium storing computer instructions, wherein the computer instructions are used for causing the computer to:
  establish a simulated unmanned vehicle and a simulation scene, wherein the simulation scene is used for the simulated unmanned vehicle to perform simulation driving;

determine a first sensor solution according to a initialization parameter, and determine, according to the first sensor solution, simulation data generated by the simulation unmanned vehicle during the simulation driving in the simulation scene; and determine a first perception parameter of the first sensor solution according to the simulation data and correct the first sensor solution according to the first perception parameter to obtain a sensor solution applied to an unmanned vehicle for operation of the unmanned vehicle;

wherein the simulation scene comprises a static simulation scene and a dynamic simulation scene, and the dynamic simulation scene comprises at least one dynamic sub-simulation scene; and the computer instructions are used for further causing the computer to:

determine, according to the first sensor solution, first sub-simulation data generated by the simulated unmanned vehicle during the simulation driving in the static simulation scene;

determine the first perception parameter of the first sensor solution according to the first sub-simulation data, and correct the first sensor solution according to the first perception parameter to obtain a second sensor solution;

determine, according to the second sensor solution, at least one second sub-simulation data generated by the simulated unmanned vehicle during the simulation driving in the at least one dynamic sub-simulation scene; and determine a second perception parameter of the second sensor solution according to each second sub-simulation data of the at least one second sub-simulation data, correct, according to the second perception parameter, the second sensor solution to obtain a third sensor solution, and use the third sensor solution as the sensor solution applied to the unmanned vehicle for the operation of the unmanned vehicle.

12. The non-transitory computer readable storage medium according to claim 11, wherein the computer instructions are used for further causing the computer to:

establish a simulated sensor, and install the simulated sensor in the simulation unmanned vehicle according to the first sensor solution; and determine the simulation data generated by the simulated unmanned vehicle installed with the simulated sensor during the simulation driving in the simulation scene.

13. The non-transitory computer readable storage medium according to claim 11, wherein the computer instructions are used for further causing the computer to:

input the simulation data into a preset sensor perception algorithm to obtain a first perception parameter represented by the simulation data; and correct, according to the first perception parameter and preset sensor perception capability requirement, the first sensor solution to obtain the sensor solution applied to the unmanned vehicle for the operation of the unmanned vehicle.

14. The non-transitory computer readable storage medium according to claim 11, wherein the sensor comprises a lidar and a camera.

* * * * *